(12) United States Patent
Redding et al.

(10) Patent No.: US 10,943,895 B2
(45) Date of Patent: Mar. 9, 2021

(54) METHOD OF FABRICATING A PLURALITY OF LINEAR ARRAYS WITH SUBMICRON Y-AXIS ALIGNMENT

(71) Applicant: Xerox Corporation, Norwalk, CT (US)

(72) Inventors: Gary D. Redding, Victor, NY (US); Joseph F. Casey, Webster, NY (US)

(73) Assignee: Xerox Corporation, Norwalk, CT (US)

( * ) Notice: Subject to any disclaimer, the term of this patent is extended or adjusted under 35 U.S.C. 154(b) by 118 days.

(21) Appl. No.: 16/247,016

(22) Filed: Jan. 14, 2019

(65) Prior Publication Data

US 2020/0227399 A1 Jul. 16, 2020

(51) Int. Cl.
*H01L 25/00* (2006.01)
*H01L 23/00* (2006.01)
(Continued)

(52) U.S. Cl.
CPC .............. *H01L 25/50* (2013.01); *H01L 24/48* (2013.01); *H01L 24/85* (2013.01);
(Continued)

(58) Field of Classification Search
CPC ..... H01L 25/50; H01L 25/0655; H01L 24/48; H01L 24/85; H01L 33/62;
(Continued)

(56) References Cited

U.S. PATENT DOCUMENTS 5,128,282 A * 7/1992 Ormond ................ H01L 21/304
                                                    257/E21.237
5,148,268 A    9/1992 Tandon et al.
(Continued)

OTHER PUBLICATIONS

U.S. Appl. No. 16/246,971, filed Jan. 14, 2019.

*Primary Examiner* — Kyoung Lee
*Assistant Examiner* — Christina A Sylvia
(74) *Attorney, Agent, or Firm* — Simpson & Simpson, PLLC

(57) ABSTRACT

A method of assembling a plurality of linear arrays from a silicon wafer having a first surface and a second surface opposite the first surface, the first surface having at least a first linear array of sensor/emitter elements and a second linear array of sensor/emitter elements, each arranged parallel relative to a first direction, and a sacrificial portion positioned between the first linear array of sensor/emitter elements and the second linear array of sensor/emitter elements. The method includes: forming a first cavity in the second surface positioned opposite the sacrificial portion and parallel relative to the first direction; forming at least a first through cut, a second through cut, a third through cut and a fourth through cut in the silicon wafer, the first and second through cuts are parallel to the first direction, the third and fourth through cuts are perpendicular to the first direction, the first through cut arranged adjacent to the first linear array of sensor/emitter elements opposite the sacrificial portion, the second through cut arranged adjacent to the second linear array of sensor/emitter elements opposite the sacrificial portion, and the third and fourth through cuts form (Continued)

a first end and a second end, respectively, of a multi-row sensor/emitter chip defined by the first, second, third and fourth through cuts; bonding at least a portion of the multi-row sensor/emitter chip formed by the second surface of the silicon wafer to a mounting substrate; and, removing the sacrificial portion.

19 Claims, 10 Drawing Sheets

(51) Int. Cl.
*H01L 33/62* (2010.01)
*H01L 27/15* (2006.01)
*H01L 27/144* (2006.01)
*H01L 25/065* (2006.01)
*H01L 31/02* (2006.01)

(52) U.S. Cl.
CPC ...... *H01L 25/0655* (2013.01); *H01L 27/1443* (2013.01); *H01L 27/1446* (2013.01); *H01L 27/153* (2013.01); *H01L 31/02005* (2013.01); *H01L 33/62* (2013.01); *H01L 2224/48091* (2013.01); *H01L 2224/48106* (2013.01); *H01L 2224/48227* (2013.01); *H01L 2924/12041* (2013.01); *H01L 2924/12043* (2013.01); *H01L 2933/0066* (2013.01)

(58) Field of Classification Search
CPC ........... H01L 31/02005; H01L 27/1443; H01L 27/1446; H01L 27/153
See application file for complete search history.

(56) References Cited

U.S. PATENT DOCUMENTS

| | | | | |
|---|---|---|---|---|
| 5,473,513 A | * | 12/1995 | Quinn | G06K 7/10841 |
| | | | | 257/E21.505 |
| 5,753,959 A | * | 5/1998 | Quinn | B41J 2/155 |
| | | | | 257/443 |
| 6,316,284 B1 | * | 11/2001 | Perregaux | H01L 27/14643 |
| | | | | 257/E27.133 |
| 7,990,528 B2 | | 8/2011 | Hosier et al. | |
| 8,129,258 B2 | | 3/2012 | Hosier et al. | |
| 2016/0104696 A1 | * | 4/2016 | LaVeigne | H01L 27/14649 |
| | | | | 257/88 |
| 2020/0228674 A1 | * | 7/2020 | Casey | H04N 1/58 |

* cited by examiner

METHOD OF FABRICATING A PLURALITY OF LINEAR ARRAYS WITH SUBMICRON Y-AXIS ALIGNMENT

TECHNICAL FIELD

The presently disclosed embodiments are directed to a method of forming a sensor/emitter array, more particularly to a method of forming a linear sensor/emitter array including a plurality of sub-arrays, and even more particularly to a method of forming a linear sensor/emitter array having submicron y-axis alignment between a plurality of sub-arrays, e.g., a plurality of arrays of photosites or light emitting elements.

BACKGROUND

Sensor arrays comprising a plurality of linearly aligned photodiodes or photosites are well known in the art. For example, a linear sensor array commonly referred to as a full width sensor array includes an array or plurality of arrays of photosensors/photodiodes/photosites having a length equal to or greater than the width of the substrate to be scanned, for example, similar to the full width array taught in U.S. Pat. No. 5,148,268. However, due to the existing equipment for fabricating such sub-arrays, the arrays have limitations in that each sensor array includes a fixed number of rows of photosensors, e.g., four (4) rows.

There are many advantages to having multi-row low-resolution image sensor arrays, e.g., two or more arrays having 600 dots per inch (dpi), in parallel to each other such that the top and bottom arrays, also referred to herein as first and second arrays, are "perfectly" aligned to each other along the long (Y) axis. It should be appreciated that the long axis or Y axis may also be referred to as the process direction axis. However, a reproduceable method to create such precision aligned arrays has heretofore remained elusive. The ability to mechanically align two rows of distinct chips relative to each other with submicron, i.e., nanometer, accuracy is currently unattainable by known means and methods.

Similarly, arrays of light emitting elements having submicron alignment accuracy has also been difficult, if not impossible, to form with known alignment and assembly techniques.

SUMMARY

The present disclosure sets forth embodiments of methods of forming a dual linear sensor/emitter array with near perfect alignment between upper and lower sensor/emitter arrays that result in several advantages over standard single array assemblies. It should be appreciated that terms such as, "upper" and "lower" are relative terms used to reference spatial positions of structures relative to each other. Moreover, the present disclosure sets forth embodiments of methods of forming sensor/emitter arrays with near perfect alignment between more than two grouped sensor/emitter arrays.

The presently disclosed embodiments achieve such accuracies of alignment using known sub-array elements and known fabrication equipment by relying on the accuracy of the wafer fabrication process, e.g., CMOS wafer fabrication, which fabrication provides submicron accuracy. The present disclosure describes a process by which a standard silicon wafer of low-resolution photosensitive chips and standard sensor array manufacturing equipment are used to fabricate a dual linear array of sensor chips with near-perfect, i.e., sub-micron, alignment of the top array to the bottom array, or similarly a linear array of sensor chips having more than top and bottom arrays. A standard device wafer is cut to create a single multi-row chip that is three or more standard chips wide, i.e., three or more rows. A recess cut is formed in the bottom side of the center of the multi-row chip, below the portion referred to as the "sacrificial area". An array is then built on a mounting substrate using the foregoing multi-row chips such that the chips are positioned adjacent to a first row of electrical connections on the mounting substrate, e.g., a circuit board, and the bottom recess straddles a second row of electrical connections on the circuit board. Upon completion of bonding the multi-row chips to the mounting substrate, i.e., the completion of forming the array, the center or sacrificial area is removed, exposing the second row of electrical connections below, resulting in two parallel arrays of sensors where the top array is in near-perfect alignment with the bottom array. It should be appreciated that while the disclosure below focuses primarily on a sensor array, the presently disclosed process may also be utilized for other types of arrays such as light emitting diode (LED) arrays, etc. Moreover, it should be appreciated that while the disclosure focuses primarily on dual array arrangements, more than two aligned arrays may also be formed.

According to aspects illustrated herein, there is provided a method of assembling a dual linear sensor array from a silicon wafer having a first surface and a second surface opposite the first surface, the first surface having at least a first linear array of sensor elements and a second linear array of sensor elements, each arranged parallel relative to a first direction, and a sacrificial portion positioned between the first linear array of sensor elements and the second linear array of sensor elements. The method includes: forming a first cavity in the second surface positioned opposite the sacrificial portion and parallel relative to the first direction; forming at least a first through cut, a second through cut, a third through cut and a fourth through cut in the silicon wafer, the first and second through cuts are parallel to the first direction, the third and fourth through cuts are perpendicular to the first direction, the first through cut arranged adjacent to the first linear array of sensor elements opposite the sacrificial portion, the second through cut arranged adjacent to the second linear array of sensor elements opposite the sacrificial portion, and the third and fourth through cuts form a first end and a second end, respectively, of a multi-row sensor chip defined by the first, second, third and fourth through cuts; bonding at least a portion of the multi-row sensor chip formed by the second surface of the silicon wafer to a mounting substrate; and, removing the sacrificial portion.

According to other aspects illustrated herein, there is provided a method of assembling a dual linear light emitting array from a silicon wafer having a first surface and a second surface opposite the first surface, the first surface having at least a first linear array of light emitting elements and a second linear array of light emitting elements, each arranged parallel relative to a first direction, and a sacrificial portion positioned between the first linear array of light emitting elements and the second linear array of light emitting elements. The method includes: forming a first cavity in the second surface positioned opposite the sacrificial portion and parallel relative to the first direction; forming at least a first through cut, a second through cut, a third through cut and a fourth through cut in the silicon wafer, the first and second through cuts are parallel to the first direction, the third and fourth through cuts are perpendicular to the first direction, the first through cut arranged adjacent to the first linear array of light emitting elements opposite the sacrificial portion, the second through cut arranged adjacent to the second linear array of light emitting elements opposite the sacrificial portion, and the third and fourth through cuts form a first end and a second end, respectively, of a multi-row light emitting chip defined by the first, second, third and fourth through cuts; bonding at least a portion of the multi-row light emitting chip formed by the second surface of the silicon wafer to a mounting substrate; and, removing the sacrificial portion.

According to other aspects illustrated herein, there is provided a method of assembling at least three linear sensor arrays from a silicon wafer having a first surface and a second surface opposite the first surface, the first surface having at least a first linear array of sensor elements, a second linear array of sensor elements and a third linear array of sensor elements, each arranged parallel relative to a first direction, a first sacrificial portion positioned between the first linear array of sensor elements and the second linear array of sensor elements, and a second sacrificial portion positioned between the second linear array of sensor elements and the third linear array of sensor elements. The method includes: forming a first cavity in the second surface positioned opposite the first sacrificial portion and parallel relative to the first direction; forming a second cavity in the second surface positioned opposite the second sacrificial portion and parallel relative to the first direction; forming at least a third street partial through cut and a fourth street partial through cut in the first surface positioned generally opposite the second cavity and parallel relative to the first direction, the third street partial through cut arranged between the second linear array of sensor elements and the second sacrificial portion, and the fourth street partial through cut arranged between the third linear array of sensor elements and the second sacrificial portion; forming at least a first through cut, a second through cut, a third through cut and a fourth through cut in the silicon wafer, the first and second through cuts are parallel to the first direction, the third and fourth through cuts are perpendicular to the first direction, the first through cut arranged adjacent to the first linear array of sensor elements opposite the first sacrificial portion, the second through cut arranged adjacent to the third linear array of sensor elements opposite the second sacrificial portion, and the third and fourth through cuts form a first end and a second end, respectively, of a multi-row sensor chip defined by the first, second, third and fourth through cuts; bonding at least a portion of the multi-row sensor chip formed by the second surface of the silicon wafer to a mounting substrate; and, removing the first sacrificial portion and the second sacrificial portion.

Other objects, features and advantages of one or more embodiments will be readily appreciable from the following detailed description and from the accompanying drawings and claims.

BRIEF DESCRIPTION OF THE DRAWINGS

Various embodiments are disclosed, by way of example only, with reference to the accompanying drawings in which corresponding reference symbols indicate corresponding parts, in which.

DETAILED DESCRIPTION

Figure 1:
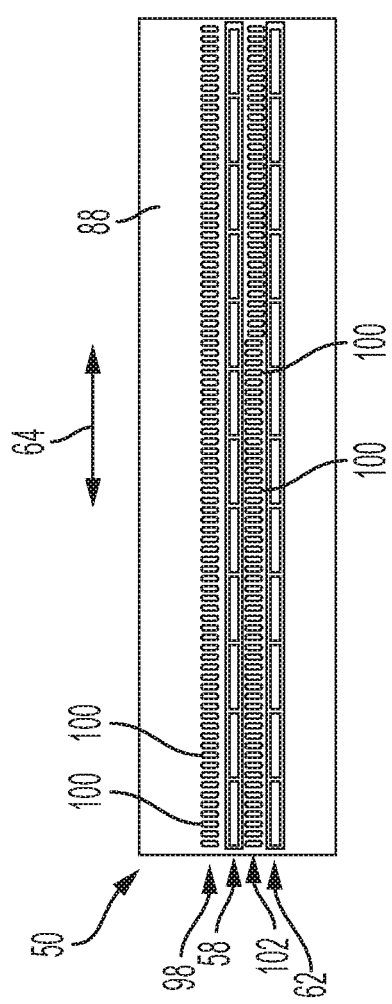
FIG. 1 is a top plan view of a dual linear sensor array formed by using an embodiment of a presently disclosed method of fabricating a sensor array.
Figure 2:
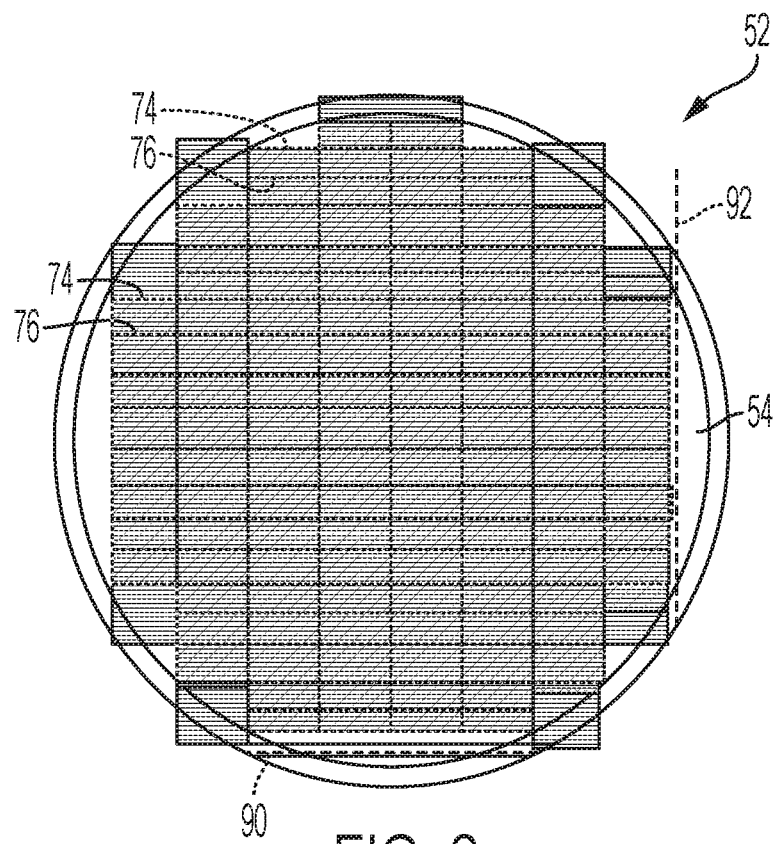
FIG. 2 is a top plan view of a silicon wafer including a plurality of multi-row sensor chips fabricated thereon.

At the outset, it should be appreciated that like drawing numbers on different drawing views identify identical, or functionally similar, structural elements of the embodiments set forth herein. Furthermore, it is understood that these embodiments are not limited to the particular methodologies, materials and modifications described and as such may, of course, vary. It is also understood that the terminology used herein is for the purpose of describing particular aspects only, and is not intended to limit the scope of the disclosed embodiments, which are limited only by the appended claims.

Unless defined otherwise, all technical and scientific terms used herein have the same meaning as commonly understood to one of ordinary skill in the art to which these embodiments belong. As used herein, "process direction" is intended to mean the direction of media transport through a printer, copier, scanner, etc., while "cross process direction" is intended to mean the perpendicular to the direction of media transport through a printer, copier, scanner, etc., or in other terms the perpendicular to the process direction. It should be appreciated that as used herein, "upper" and "lower" sensor arrays refer to two arrays offset in the process direction. For example, the upper sensor array is the first sensor array, relative to the process direction, that scans media moving in the process direction, while the lower sensor array is the second sensor array, relative to the process direction, that scans media moving in the process direction. As used herein, "precision alignment" and "submicron alignment" are intended to mean alignment within one micron or less. For example, the foregoing terms may be construed to mean photosite centerlines aligned to within +/−0.9 microns (μm); however, the terms are not limited to that accuracy. Moreover, it should be appreciated that the precision/submicron alignment described herein is believed to be maintained at temperatures below the glass transition temperature (Tg) of the bonding material used to secure the sensor array to the mounting substrate, e.g., adhesive. Additionally, it is believed that equivalent movement should occur for each sensor array bonded to the mounting substrate provided that equivalent amounts of bonding material are used for each sensor array.

Furthermore, as used herein, "printer," "printer system", "printing system", "printer device" and "printing device" as used herein encompasses any apparatus, such as a digital copier, bookmaking machine, facsimile machine, multifunction machine, etc. which performs a print outputting function for any purpose, while "multi-function device" and "MFD" as used herein is intended to mean a device which includes a plurality of different imaging devices, including but not limited to, a printer, a copier, a fax machine and/or a scanner, and may further provide a connection to a local area network, a wide area network, an Ethernet based network or the internet, either via a wired connection or a wireless connection. An MFD can further refer to any hardware that combines several functions in one unit. For example, MFDs may include but are not limited to a standalone printer, one or more personal computers, a standalone scanner, a mobile phone, an MP3 player, audio electronics, video electronics, GPS systems, televisions, recording and/or reproducing media or any other type of consumer or non-consumer analog and/or digital electronics. Additionally, as used herein, "sheet," "sheet of paper" and "paper" refer to, for example, paper, transparencies, parchment, film, fabric, plastic, photo-finishing papers or other coated or non-coated substrate media in the form of a web upon which information or markings can be visualized and/or reproduced.

It should be appreciated that as used herein terms such as "photosensor", "photosite", and "photodiode" are used interchangeably and are intended to mean an element, e.g., a semiconductor device, that converts light into an electrical energy such as current, which electrical energy can subsequently be used to quantify the amount, e.g., intensity, duration, etc., of light impinging on the element. A "photosensor array" is intended to mean a two dimensional (2D) array of photosites, such as for example, an array having four (4) parallel and adjacent rows of one hundred twenty-eight (128) photosites.

As used herein, the term 'average' shall be construed broadly to include any calculation in which a result datum or decision is obtained based on a plurality of input data, which can include but is not limited to, weighted averages, yes or no decisions based on rolling inputs, etc. Moreover, as used herein, the phrases "comprises at least one of" and "comprising at least one of" in combination with a system or element is intended to mean that the system or element includes one or more of the elements listed after the phrase. For example, a device comprising at least one of: a first element; a second element; and, a third element, is intended to be construed as any one of the following structural arrangements: a device comprising a first element; a device comprising a second element; a device comprising a third element; a device comprising a first element and a second element; a device comprising a first element and a third element; a device comprising a first element, a second element and a third element; or, a device comprising a second element and a third element. A similar interpretation is intended when the phrase "used in at least one of:" is used herein. Furthermore, as used herein, "and/or" is intended to mean a grammatical conjunction used to indicate that one or more of the elements or conditions recited may be included or occur. For example, a device comprising a first element, a second element and/or a third element, is intended to be construed as any one of the following structural arrangements: a device comprising a first element; a device comprising a second element; a device comprising a third element; a device comprising a first element and a second element; a device comprising a first element and a third element; a device comprising a first element, a second element and a third element; or, a device comprising a second element and a third element.

Moreover, although any methods, devices or materials similar or equivalent to those described herein can be used in the practice or testing of these embodiments, some embodiments of methods, devices, and materials are now described.

Broadly, the present disclosure includes a method of assembling dual linear sensor array 50 from silicon wafer 52. Silicon wafer 52 comprises first surface 54 and second surface 56 opposite first surface 54. First surface 54 comprises at least two linear arrays of sensor elements, e.g., first linear array 58 of sensor elements 60 and second linear array 62 of sensor elements 60. Each of arrays 58 and 62 of sensors elements 60 are arranged parallel relative to first direction 64. Moreover, first surface 54 includes sacrificial portion 66 positioned between first linear array 58 of sensor elements 60 and second linear array 62 of sensor elements 60.

In some embodiments, the present method comprises: forming first cavity 68 in second surface 56 positioned opposite sacrificial portion 66 and parallel relative to first direction 64; forming at least first street partial through cut 70 and second street partial through cut 72 in first surface 54 positioned generally opposite first cavity 68 and parallel relative to first direction 64, first street partial through cut 70 is arranged between first linear array 58 of sensor elements 60 and sacrificial portion 66, and second street partial through cut 72 is arranged between second linear array 62 of sensor elements 60 and sacrificial portion 66; forming at least first through cut 74, second through cut 76, third through cut 78 and fourth through cut 80 in silicon wafer 52, first and second through cuts 74 and 76, respectively, are parallel to first direction 64, third and fourth through cuts 78 and 80, respectively, are perpendicular to first direction 64, first through cut 74 is arranged adjacent to first linear array 58 of sensor elements 60 opposite sacrificial portion 66, second through cut 76 is arranged adjacent to second linear array 62 of sensor elements 60 opposite sacrificial portion 66, and third and fourth through cuts 78 and 80, respectively, form first end 82 and second end 84, respectively, of multi-row sensor chip 86 defined by first, second, third and fourth through cuts 74, 76, 78 and 80, respectively; bonding at least a portion of multi-row sensor chip 86 formed by second surface 56 of silicon wafer 52 to mounting substrate 88; and, removing sacrificial portion 66. However, it should be appreciated that the step of forming at least first street partial through cut 70 and second street partial through cut 72 occurs for embodiments wherein sacrificial portion 66 is removed by cleaving, as described in greater detail below. Thus, in embodiments wherein sacrificial portion 66 is not removed by cleaving, the first and second street partial through cuts may not be formed.

It should be appreciated that mounting substrate 88 may be one of a variety of structures. For example, mounting substrate 88 may be a printed board (PB), a printed wiring board (PWB), a printed circuit board (PCB), or any other substrate capable of accepting and bonding to multi-row sensor chip 86. Preferably, such mounting substrates experience low amounts of thermal expansion and are not subject to change due to vibrational forces. However, substrates that are subject to thermal expansion and vibrational changes may also be used.

In some embodiments, the present method may further comprise: forming first reference through cut 90 in first surface 54 parallel to first direction 64, wherein a position of first cavity 68 is defined by a position of first reference through cut 90. It should be appreciated that by one position being defined by another position, it is intended to mean that one position is used as a reference location from which the second position is aligned, formed, etc. In some embodiments, the present method still further comprises or comprise in the alternative: forming second reference through cut 92 in first surface 54 perpendicular to first direction 64; and, forming second cavity 94 in second surface 56 perpendicular relative to first direction 64, wherein a position of second cavity 94 is defined by a position of second reference through cut 92.

In some embodiments, the present method further comprises: forming second cavity 94 in second surface 56 perpendicular to first direction 64; and, forming at least first column partial through cut 96 in first surface 54 positioned generally opposite second cavity 94 and perpendicular to first direction 64.

Figure 7:
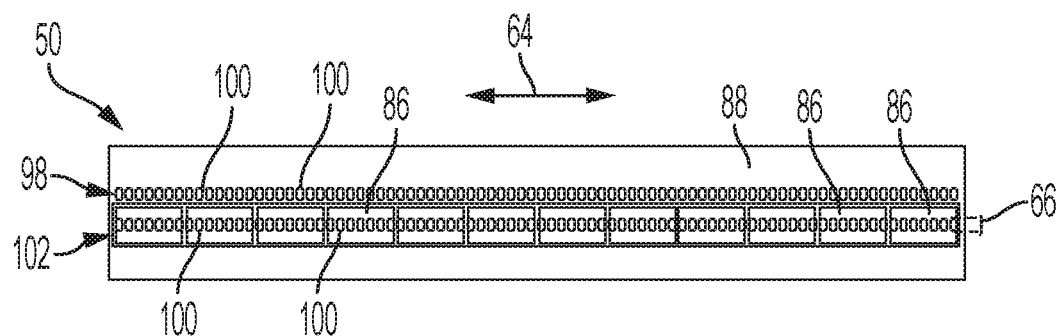
FIG. 7 is a top plan view of a dual linear sensor array formed by using an embodiment of a presently disclosed method of fabricating a sensor array having a plurality of multi-row sensor chips positioned on a mounting substrate.
Figure 8:
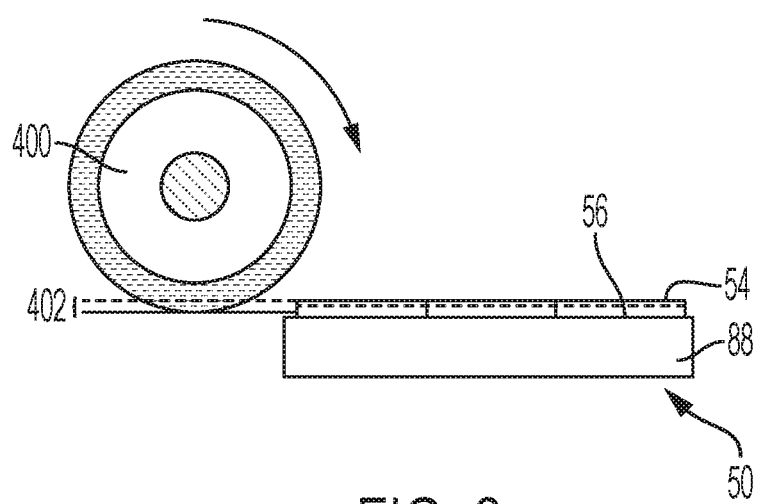
FIG. 8 is a side elevational view of a dicing saw aligned for removal of a sacrificial portion of a multi-row sensor chip in accordance with an embodiment of the presently disclosed method of fabricating a sensor chip array.
Figure 9:
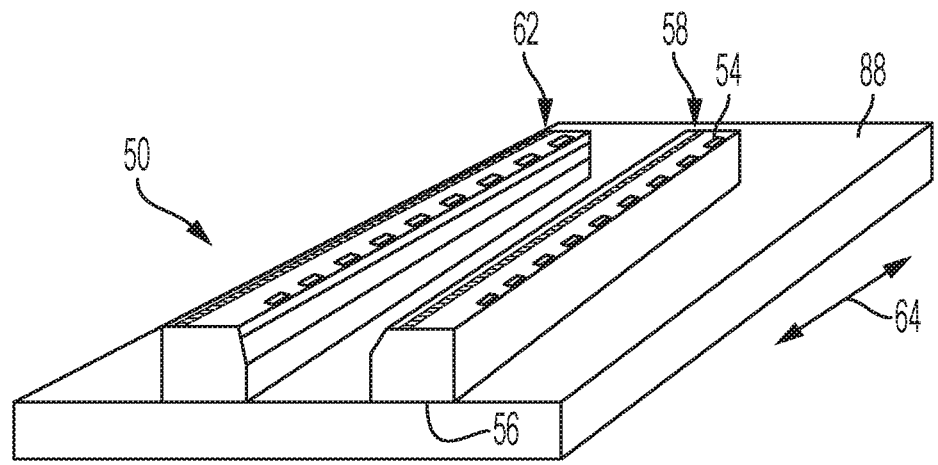
FIG. 9 is a perspective view of a dual linear array with submicron Y-axis alignment after removal of the sacrificial portion from the multi-row sensor chip in accordance with an embodiment of the presently disclosed method of fabricating a sensor chip array.
Figure 10:
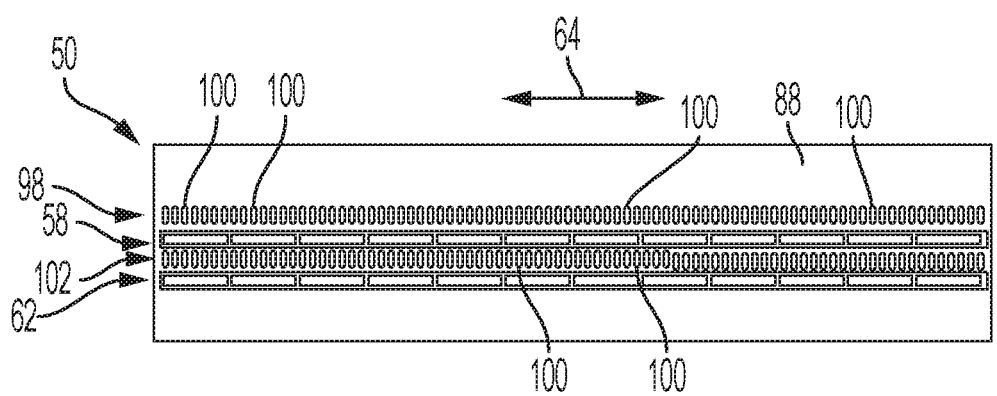
FIG. 10 is a top plan view of a dual linear array with submicron Y-axis alignment after removal of the sacrificial portion from the multi-row sensor chip in accordance with an embodiment of the presently disclosed method of fabricating a sensor chip array.
Figure 11:
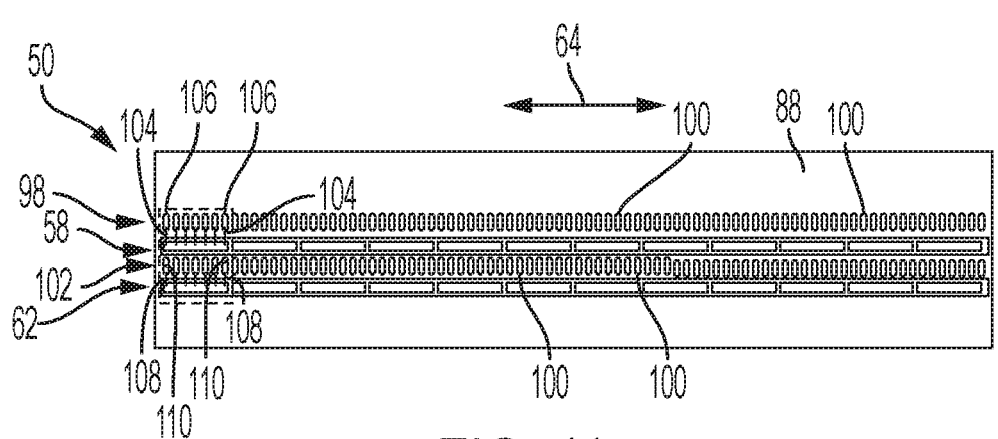
FIG. 11 is a top plan view of a dual linear array with submicron Y-axis alignment after removal of the sacrificial portion from the multi-row sensor chip and attachment of several wires between the mounting substrate and the sensor arrays in accordance with an embodiment of the presently disclosed method of fabricating a sensor chip array.
Figure 12:
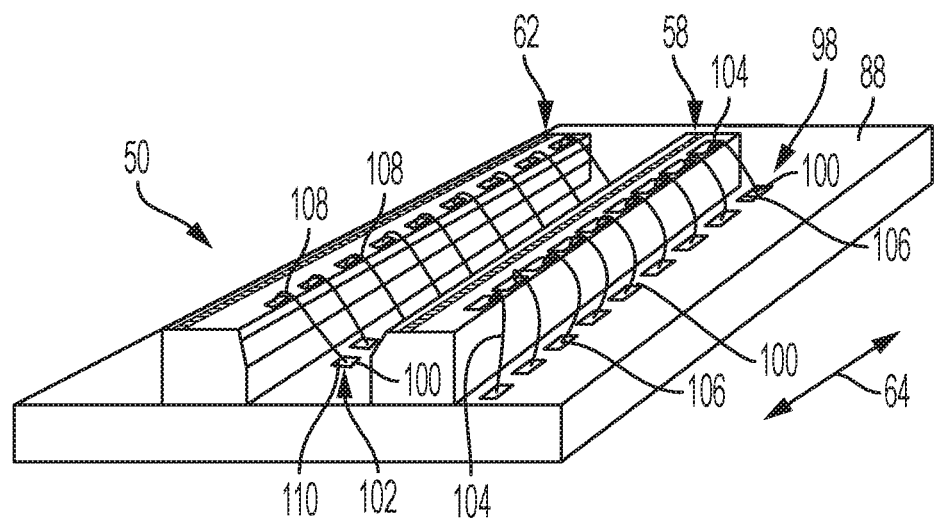
FIG. 12 is a perspective view of a dual linear array with submicron Y-axis alignment after removal of the sacrificial portion from the multi-row sensor chip and attachment of several wires between the mounting substrate and the sensor arrays in accordance with an embodiment of the presently disclosed method of fabricating a sensor chip array.
Figure 13:
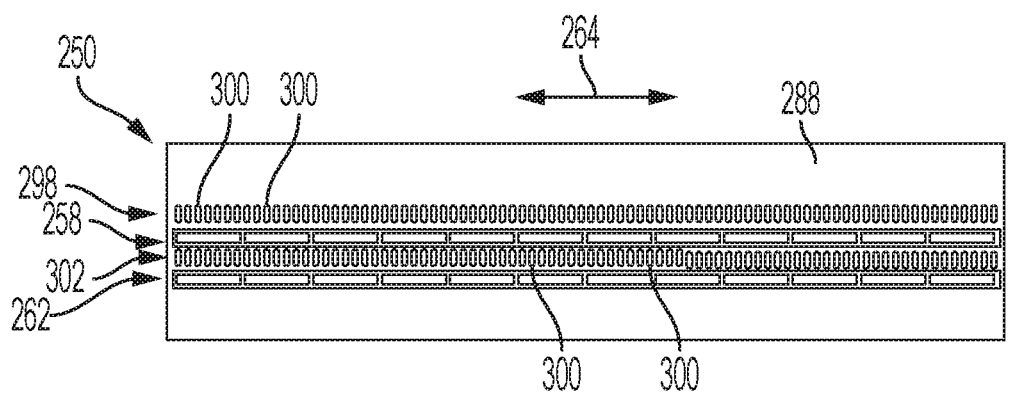
FIG. 13 a top plan view of a dual linear light emitter array formed by using an embodiment of a presently disclosed method of fabricating a light emitter array.
Figure 14:
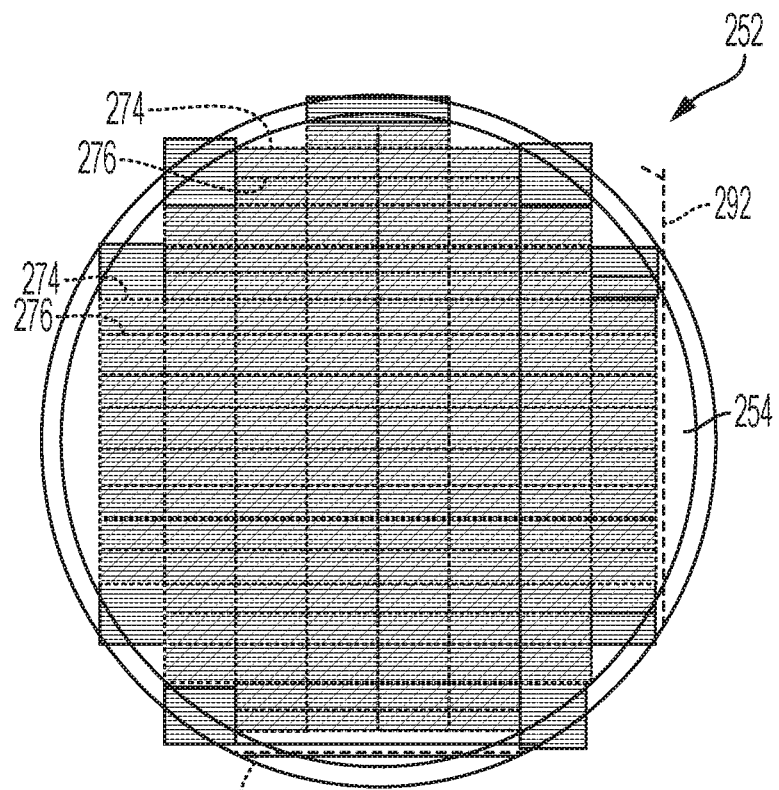
FIG. 14 is a top plan view of a silicon wafer including a plurality of multi-row light emitting chips fabricated thereon.
Figure 15:
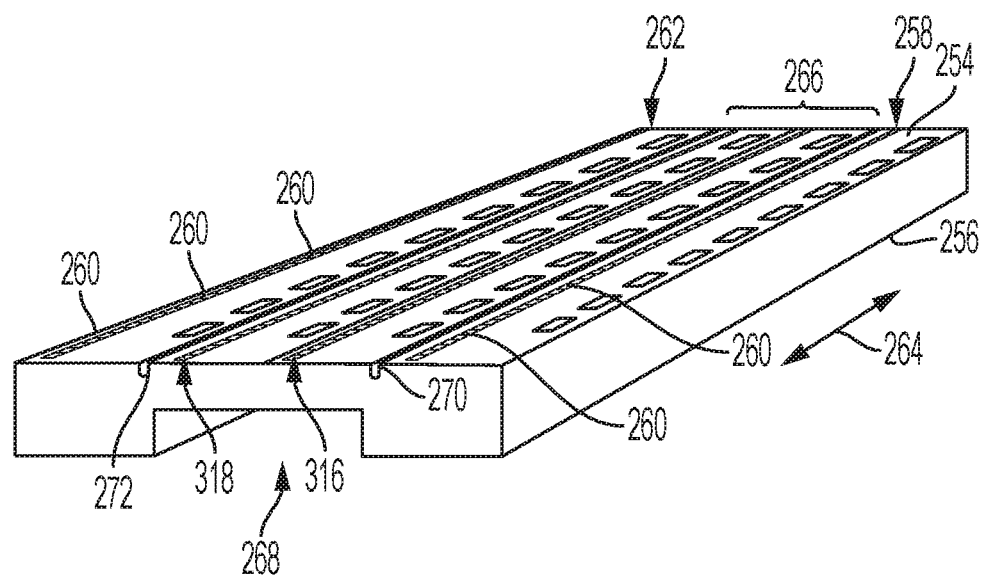
FIG. 15 is a perspective view of a multi-row light emitting chip after separation from the silicon wafer depicted in FIG. 14.
Figure 16:
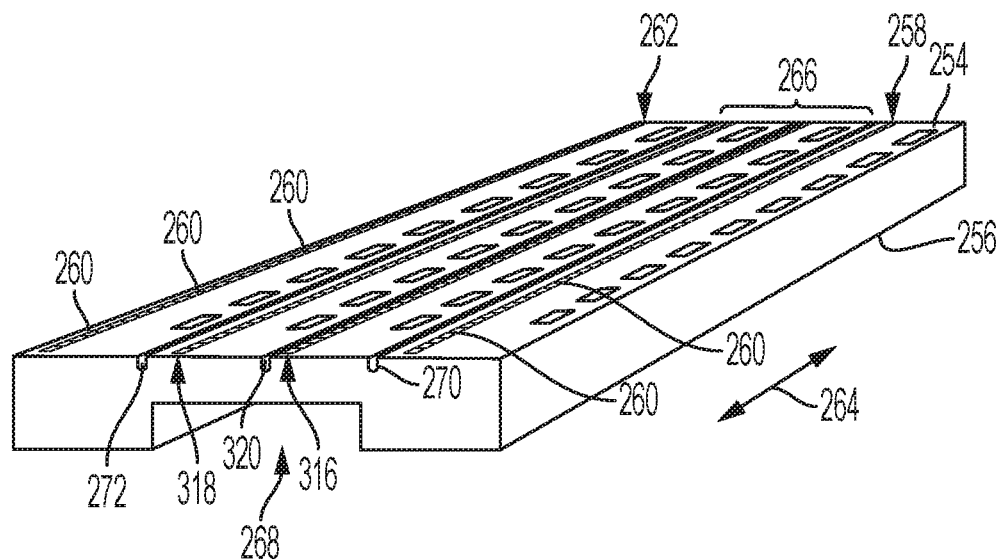
FIG. 16 is a perspective view of a multi-row light emitting chip after separation from the silicon wafer depicted in FIG. 14.

It should be appreciated, that silicon wafer 52 may include a plurality of multi-row sensor chips 86, and as such, a plurality of sensor chips 86 may be cut from silicon wafer 52 and used to form dual linear sensor arrays of various lengths. Thus, in some embodiments, the present method may further comprise: repeating the step of forming first through cut 74, second through cut 76, third through cut 78 and fourth through cut 80 at unique locations in silicon wafer 52, thereby forming a plurality of multi-row sensor chips 86, each of the plurality of multi-row sensor chips 86 comprises first linear array 58 of sensor elements 60 and second linear array 62 of sensor elements 60, each arranged parallel relative to first direction 64, and further comprises sacrificial portion 66; bonding at least a portion of each of the plurality of multi-row sensor chips 86 formed by second surface 56 of silicon wafer 52 adjacently to mounting substrate 88; and, removing each of the plurality of sacrificial portions 66. In these embodiments, bonding the plurality of multi-row sensor chips "adjacently" is intended to mean that each multi-row sensor chip is bonded to the mounting substrate to form a line of multi-row sensor chips such that the line of chips collectively forms a linear array of multi-row chips, as depicted in FIG. 7.

In some embodiments, mounting substrate 88 comprises at least first row 98 of electrical connectors 100 and second row 102 of electrical connectors 100 parallel to first row 98. In those embodiments, the above described step of bonding at least a portion of multi-row sensor chip 86 formed by second surface 56 of silicon wafer 52 to mounting substrate 88 results in aligning sacrificial portion 66 over second row 102 of electrical connectors 100.

In some embodiments, the present method further comprises: bonding at least one first wire 104 between first electrical connector 106 on mounting substrate 88 and first linear array 58 of sensor elements 60; and, bonding at least one second wire 108 between second electrical connector 110 on mounting substrate 88 and second linear array 62 of sensor elements 60.

A variety of methods of forming partial through cuts and full through cuts may be used in the presently disclosed methods. In some embodiments, at least one of: the step of forming first cavity 68; the step of forming at least first street partial through cut 70 and second street partial through cut 72; and, the step of forming at least first through cut 74, second through cut 76, third through cut 78 and fourth through cut 80, is performed by mechanical abrasion, e.g., a cutting blade, laser cutting, chemical etching, or a combination thereof.

Various methods may be used to remove sacrificial portion 66 after bonding multi-row sensor chip 86 to mounting substrate 88. For example, in some embodiments, the step of removing sacrificial portion 66 comprises: forming fifth through cut 112 positioned generally opposite first cavity 68 and parallel relative to first direction 64, fifth through cut 112 arranged between first linear array 58 of sensor elements 60 and sacrificial portion 66; and, forming sixth through cut 114 positioned generally opposite first cavity 68 and parallel relative to first direction 64, sixth through cut 114 arranged between second linear array 62 of sensor elements 60 and sacrificial portion 66. In some embodiments, for example, the step of removing sacrificial portion 66 comprises: cleaving sacrificial portion 66 along first street partial through cut 70 and along second street partial through cut 72.

It should be appreciated that sacrificial portion 66 may take a variety of forms. For example, in some embodiments, sacrificial portion 66 comprises third linear array 116 of sensor elements 60. Alternatively, sacrificial portion 66 may be left blank, or may include test patterns, alignment patterns, etc.

Depending on factors including but not limited to the dimensions of the linear arrays of sensor elements and the reproducibility of the cleaving process, additional partial through cuts may be formed prior to the step of cleaving in order to help with the process of removing sacrificial portion 66. In some embodiments, sacrificial portion 66 comprises fourth linear array 118 of sensor elements 60, and the present method further comprises: forming at least third street partial through cut 120 in first surface 54 positioned generally opposite first cavity 68 and parallel relative to first direction 64, where third street partial through cut 120 is arranged between third linear array 116 of sensor elements 60 and fourth linear array 118 of sensor elements 60. It should be appreciated that as described above, sacrificial portion 66 may be formed without any arrays of sensor elements therein. Thus, third street partial through cut 120 may be formed between first street partial through cut 70 and second street partial through cut 72. Downward pressure applied to sacrificial portion 66 will cause the cleaving of first, second and third street partial through cuts 70, 72 and 120, respectively, in a simultaneous or nearly simultaneous fracture or cleave.

Although the above described embodiments are directed to multi-row sensor chip assemblies, it should be appreciated that it is also possible to use similar methods to form multi-row light emitter assemblies. Thus, broadly the present disclosure includes a method of assembling dual linear light emitting array 250 from silicon wafer 252 comprising first surface 254 and second surface 256 opposite first surface 254. First surface 254 comprises at least two linear array of light emitting elements, e.g., first linear array 258 of light emitting elements 260 and second linear array 262 of light emitting elements 260. Each of arrays 258 and 262 of light emitting elements 260 are arranged parallel relative to first direction 264. Moreover, first surface 254 comprises sacrificial portion 266 positioned between first linear array 258 of light emitting elements 260 and second linear array 262 of light emitting elements 260. The present method, similar to the embodiments described above, comprises: forming first cavity 268 in second surface 256 positioned opposite sacrificial portion 266 and parallel relative to first direction 264; forming at least first street partial through cut 270 and second street partial through cut 272 in first surface 254 positioned generally opposite first cavity 268 and parallel relative to first direction 264, where first street partial through cut 270 is arranged between first linear array 258 of light emitting elements 260 and sacrificial portion 266, and second street partial through cut 272 is arranged between second linear array 262 of light emitting elements 260 and sacrificial portion 266; forming at least first through cut 274, second through cut 276, third through cut 278 and fourth through cut 280 in silicon wafer 252, where first and second through cuts 274 and 276, respectively, are parallel to first direction 264, third and fourth through cuts 278 and 280, respectively, are perpendicular to first direction 264, first through cut 274 is arranged adjacent to first linear array 258 of light emitting elements 260 opposite sacrificial portion 266, second through cut 276 arranged adjacent to second linear array 262 of light emitting elements 260 opposite sacrificial portion 266, and third and fourth through cuts 278 and 280, respectively, form first end 282 and second end 284, respectively, of multi-row light emitting chip 286 defined by first, second, third and fourth through cuts 274, 276, 278 and 280; bonding at least a portion of multi-row light emitting chip 286 formed by second surface 256 of silicon wafer 252 to mounting substrate 288; and, removing sacrificial portion 266. However, it should be appreciated that the step of forming at least first street partial through cut 270 and second street partial through cut 272 occurs for embodiments wherein sacrificial portion 266 is removed by cleaving, as described in greater detail below. Thus, in embodiments wherein sacrificial portion 266 is not removed by cleaving, the first and second street partial through cuts may not be formed.

It should be appreciated that mounting substrate 288 may be one of a variety of structures. For example, mounting substrate 288 may be a printed board (PB), a printed wiring board (PWB), a printed circuit board (PCB), or any other substrate capable of accepting and bonding to multi-row light emitting chip 286. Preferably, such mounting substrates experience low amounts of thermal expansion and are not subject to change due to vibrational forces. However, substrates that are subject to thermal expansion and vibrational changes may also be used.

In some embodiments, the present method may further comprise: forming first reference through cut 290 in first surface 254 parallel to first direction 264, wherein a position of first cavity 268 is defined by a position of first reference through cut 290. It should be appreciated that by one position being defined by another position, it is intended to mean that one position is used as a reference location from which the second position is aligned, formed, etc. In some embodiments, the present method still further comprises or comprise in the alternative: forming second reference through cut 292 in first surface 254 perpendicular to first direction 264; and, forming second cavity 294 in second surface 256 perpendicular relative to first direction 264, wherein a position of second cavity 294 is defined by a position of second reference through cut 292.

In some embodiments, the present method further comprises: forming second cavity 294 in second surface 256 perpendicular to first direction 264; and, forming at least first column partial through cut 296 in first surface 254 positioned generally opposite second cavity 294 and perpendicular to first direction 264.

Figure 19:
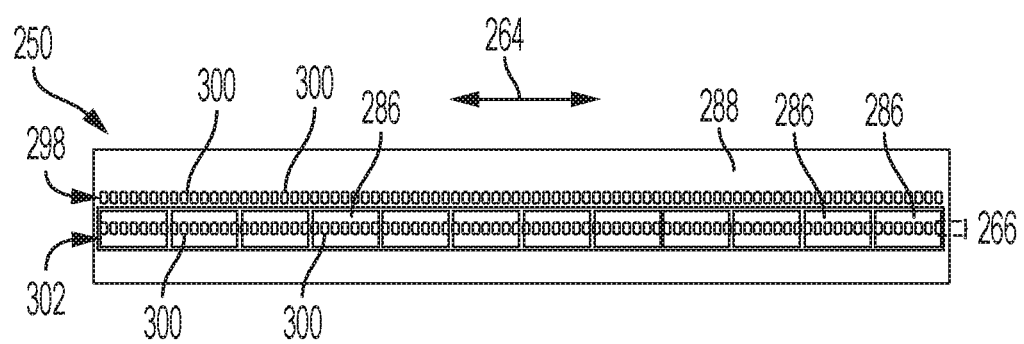
FIG. 19 is a top plan view of a dual linear light emitter array formed by using an embodiment of a presently disclosed method of fabricating a light emitter array having a plurality of multi-row light emitting chips positioned on a mounting substrate.
Figure 20:
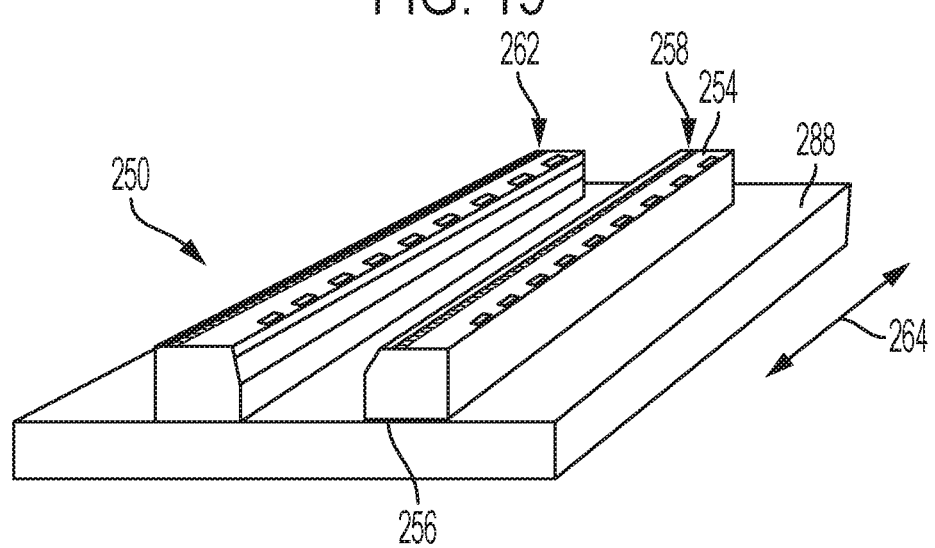
FIG. 20 is a perspective view of a dual linear array with submicron Y-axis alignment after removal of the sacrificial portion from the multi-row light emitter chip in accordance with an embodiment of the presently disclosed method of fabricating a light emitter chip array; and, FIG. 21 is a cross sectional view of a multi-row sensor chip having three linear arrays of sensor prior to removal of two sacrificial portions arranged between the linear arrays.

Again, similar to embodiments described above, in some embodiments, the present method further comprises: repeating the step of forming first through cut 274, second through cut 276, third through cut 278 and fourth through cut 280 at unique locations in silicon wafer 252, thereby forming a plurality of multi-row light emitting chips 286, where each of the plurality of multi-row light emitting chips 286 comprises first linear array 258 of light emitting elements 260 and second linear array 262 of light emitting elements 260, each of which is arranged parallel relative to first direction 264, and each of the plurality of multi-row light emitting chips 286 further comprises sacrificial portion; bonding at least a portion of each of the plurality of multi-row light emitting chips 286 formed by second surface 256 of silicon wafer 252 adjacently to mounting substrate 288; and, removing each of the plurality of sacrificial portions 266. In these embodiments, bonding the plurality of multi-row light emitting chips "adjacently" is intended to mean that each multi-row light emitting chip is bonded to the mounting substrate to form a line of multi-row light emitting chips such that the line of chips collectively forms a linear array of multi-row chips as, depicted in FIG. 19.

In some embodiments, mounting substrate 288 comprises at least first row 298 of electrical connectors 300 and second row 302 of electrical connectors 300 parallel to first row 298, and the step of bonding at least a portion of multi-row light emitting chip 286 formed by second surface 256 of silicon wafer 252 to mounting substrate 288 results in aligning sacrificial portion 266 over second row 302 of electrical connectors 300.

In some embodiments, the present method further comprises: bonding at least one first wire between a first electrical connector on mounting substrate 288 and first linear array 258 of light emitting elements 260; and, bonding at least one second wire between a second electrical connector on mounting substrate 288 and second linear array 262 of light emitting elements 260.

A variety of methods of forming partial through cuts and full through cuts may be used in the presently disclosed methods. In some embodiments, at least one of: the step of forming first cavity 268; the step of forming at least first street partial through cut 270 and second street partial through cut 272; and, the step of forming at least first through cut 274, second through cut 276, third through cut 278 and fourth through cut 280, is performed by mechanical abrasion, e.g., a cutting blade, laser cutting, chemical etching, or a combination thereof.

Various methods may be used to remove sacrificial portion 266 after bonding multi-row light emitting chip 286 to mounting substrate 288. For example, in some embodiments, the step of removing sacrificial portion 266 comprises: forming fifth through cut 312 positioned generally opposite first cavity 268 and parallel relative to first direction 264, fifth through cut 312 arranged between first linear array 258 of sensor elements 260 and sacrificial portion 266; and, forming sixth through cut 314 positioned generally opposite first cavity 268 and parallel relative to first direction 264, sixth through cut 314 arranged between second linear array 262 of sensor elements 260 and sacrificial portion 266. In some embodiments, for example, the step of removing sacrificial portion 266 comprises: cleaving sacrificial portion 266 along first street partial through cut 270 and along second street partial through cut 272.

It should be appreciated that sacrificial portion 266 may take a variety of forms. For example, in some embodiments, sacrificial portion 266 comprises third linear array 316 of light emitting elements 260. Alternatively, sacrificial portion 266 may be left blank, or may include test patterns, alignment patterns, etc.

Depending on factors including but not limited to the dimensions of the linear arrays of light emitting elements and on the reproducibility of the cleaving process, additional partial through cuts may be formed prior to the step of cleaving in order to help with the process of removing sacrificial portion 266. In some embodiments, sacrificial portion 266 comprises fourth linear array 318 of light emitting elements 260, and the present method further comprises: forming at least third street partial through cut 320 in first surface 254 positioned generally opposite first cavity 268 and parallel relative to first direction 264, where third street partial through cut 320 is arranged between third linear array 316 of light emitting elements 260 and fourth linear array 318 of light emitting elements 260. It should be appreciated that as described above, sacrificial portion 266 may be formed without any arrays of light emitting elements therein. Thus, third street partial through cut 320 may be formed between first street partial through cut 270 and second street partial through cut 272. Downward pressure applied to sacrificial portion 266 will cause the cleaving of first, second and third street partial through cuts 270, 272 and 320, respectively, in a simultaneous or nearly simultaneous fracture or cleave.

The above described embodiments of the present method set forth means of fabricating a dual linear array having submicron y-axis, i.e., process direction, alignment. The following is a more detailed explanation of those embodiments with specific operations and equipment described related thereto. It should be appreciated that the following examples are intended to further explain how the present methods may be performed, but not intended to limit the scope of the claims. Thus, the following steps provide further embodiments of the present method, and although described with "Step 1", "Step 2", etc., may be performed without including all of the steps set forth, and may be performed in a different order of steps than set forth.

Step 1—Form reference cuts on the top surface of a silicon wafer using a dicing saw, e.g., dicing saw 400. The reference cuts are used to assist with locating subsequent cuts on the bottom surface of the wafer with respect to the topside circuitry. It should be appreciated that the terms "top", "topside", "bottom" and "bottomside" are relative terms used to discuss opposing sides of a silicon wafer. An example of forming similar reference cuts is disclosed in U.S. Patent Application Publication No. 2011/0147898A1. Unlike the reference cuts disclosed in the foregoing patent application publication, the present method may use reference cuts formed in both the X and Y directions. Additionally, it is also possible to form column cuts, i.e., partial through cuts in the top surface, at this step in the process. The column cuts are used to define the beginning and end of each set of rows of sensor chips or light emitting elements.

Figure 3:
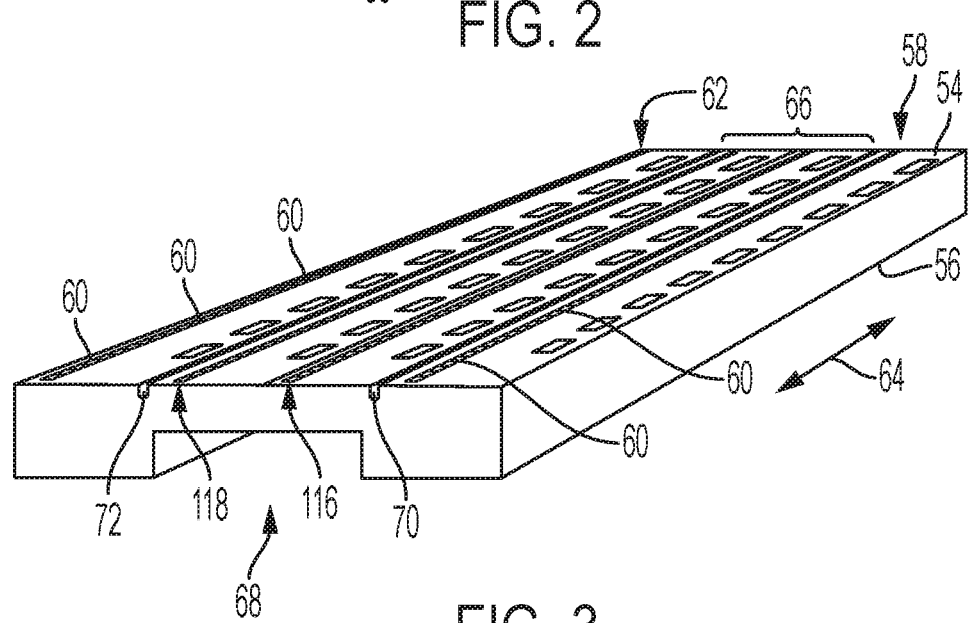
FIG. 3 is a perspective view of a multi-row sensor chip after separation from the silicon wafer depicted in FIG. 2.
Figure 4:
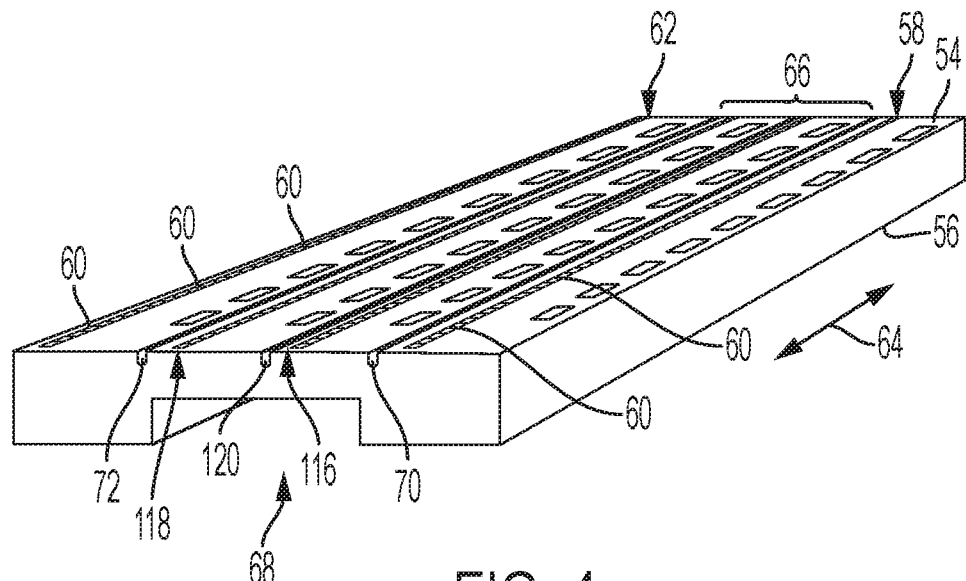
FIG. 4 is a perspective view of a multi-row sensor chip after separation from the silicon wafer depicted in FIG. 2.
Figure 5:
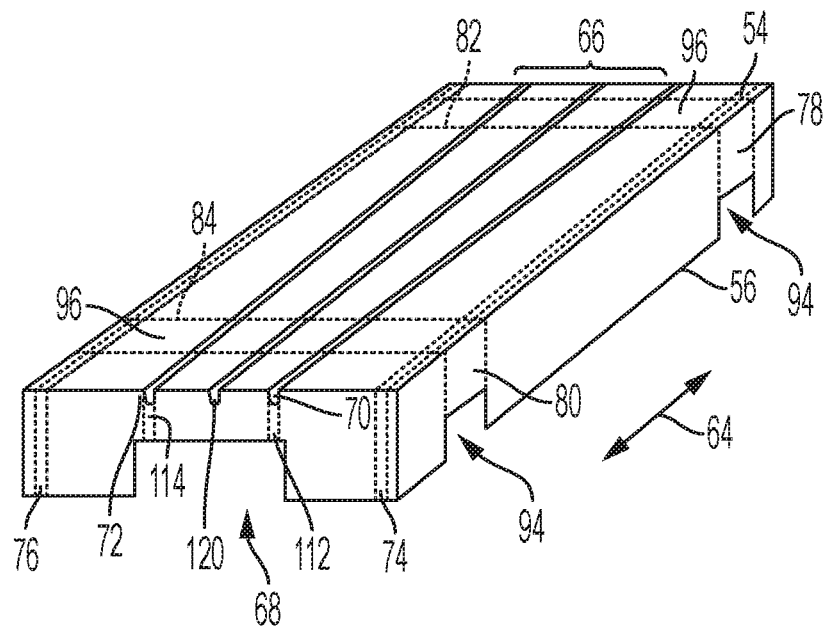
FIG. 5 is a perspective view of a portion of a silicon wafer including a multi-row sensor chip before separation from the silicon wafer depicted in FIG. 2 with the photosensor elements and electrical connections removed for clarity and further depiction of cavity cuts within the bottom surface of the silicon wafer and the relative arrangement of various street and column cuts within the top surface of the silicon wafer, both partial through cuts and full through cuts.

Step 2—Form back-cuts in both the X and Y directions, using a dicing saw, to create cavities underneath the column cuts in the Y-axis and to create cavities underneath the sacrificial portion, which may include one or more rows of chips, in the X-axis. These cuts are generally depicted in FIGS. 3 through 5. It should be noted that although some of the figures depict two sacrificial rows of chips, it is possible to include more or less than two rows, as this may be defined at the time of forming the chips on the silicon wafer.

Step 3—Cut trenches (grooves) into the topside of the silicon wafer, using a dicing saw, along the Y-axis, also known as the street area, of every chip row. The foregoing trenches serve two purposes: 1) to allow for dicing coolant to aid in the cutting of the Y-axis through cuts; and, 2) to allow for a potential brake-line/cleave-line in the multi-row chip. See FIGS. 3 through 5.

Step 4—Make through-cuts in the silicon wafer in both the X-axis and the Y-axis, using a dicing saw, such that every column formed in Step 1 is cut through, but only make street through-cuts about multiple of rows of sensor chips to create a single multi-row chip that includes three or more rows of sensor chips.

Figure 6:
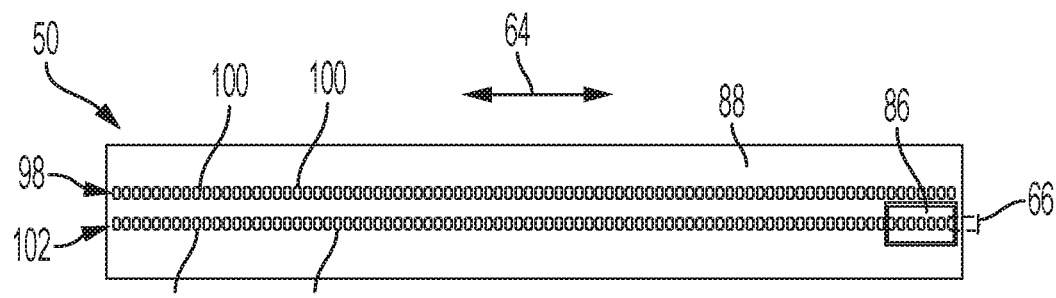
FIG. 6 is a top plan view of a dual linear sensor array formed by using an embodiment of a presently disclosed method of fabricating a sensor array having a single multi-row sensor chip positioned on a mounting substrate.

Step 5—Pick and place a single multi-row chip onto a circuit board, using a precision die bonder, such that the upper row of sensor chips on the multi-row chip resides just below a first row of electrical connections and the center or sacrificial area of the multi-row sensor chip straddles a second row of electrical connections on a beginning edge of a circuit board. See FIG. 6. It should be noted that intermediate steps such as picking multi-row chips from a silicon wafer cut in accordance with Step 4 and subsequently placing those chips into a storage container, e.g., wafflepack, may be desired prior to this step. Moreover, after placement onto the circuit board, each chip is bonded to the circuit board, e.g., a printed wiring board (PWB).

Step 6—Repeat the process of Step 5, i.e., picking and placing the multi-row chips on the die bonder, to build a precision array, similar to standard array build processes. See FIG. 7.

Step 7—Upon completion of the bond process, including curing of any adhesives if necessary, the central, sacrificial area of all the multi-row chips is then removed. See FIGS. 8 through 12. While there are many ways to remove the sacrificial areas, two distinct methods to remove the sacrificial area are included herein: 1) Place the entire array onto dicing saw 400, and cut through the central, sacrificial area, along the scribe cuts formed in Step 3, to remove the central, sacrificial portion, which may include chips, where height 402 of dicing blade 400 is such that it will cut into the pocketed area on the bottom-side of the multi-row chips formed in Step 2, but not so deep as to cut into the circuitry on the circuit board; and, 2) Remove the central, sacrificial area by performing a controlled "cleave" of the central, sacrificial area, whereby the chip will break along the scribed areas on the multi-row chip formed in Step 3 while the two portions of the multi-row chip that are bonded in place remain.

Step 8—Bond wires to the sensor chips in accordance with normal procedures; however, for the present method of forming a dual array, the number of wires are double that of a typical single array. See FIGS. 11 and 12.

Step 9—Perform final testing and final module build steps for a dual array, which testing and steps are similar to known methods, except that they are modified to accommodate the dual array.

It should be appreciated that although the various embodiments of methods of assembling a multi-array sensor discussed above are directed to assembling two aligned arrays of sensors or emitters, the methods may be readily modified to form multi-row sensor chips comprising more than two aligned sensor or emitter arrays. The following is an example embodiment wherein a multi-row sensor is formed comprising three aligned arrays of sensor elements.

Some embodiments include a method of assembling a multi-row sensor array comprising at least three linear sensor arrays, i.e., linear sensor arrays 450, 452 and 454, from portion 456 of a silicon wafer comprising first surface 458 and second surface 460 opposite first surface 458. First surface 458 comprises at least first linear array of sensor elements 450, second linear array of sensor elements 452 and third linear array of sensor elements 454, each arranged parallel relative to a first direction, i.e., a direction perpendicular to the plane of the figure. Portion 456 further comprises first sacrificial portion 462 is positioned between first linear array of sensor elements 450 and second linear array of sensor elements 452, and second sacrificial portion 464 is positioned between second linear array of sensor elements 452 and third linear array of sensor elements 454. The method comprises: forming first cavity 466 in second surface 460 positioned opposite first sacrificial portion 462 and parallel relative to the first direction; forming second cavity 468 in second surface 460 positioned opposite second sacrificial portion 464 and parallel relative to the first direction; forming at least first street partial through cut 470 and second street partial through cut 472 in first surface 458 positioned generally opposite first cavity 466 and parallel relative to the first direction, where first street partial through cut 470 is arranged between first linear array of sensor elements 450 and first sacrificial portion 462, and second street partial through cut 472 is arranged between second linear array of sensor elements 452 and first sacrificial portion 462; forming at least third street partial through cut 474 and fourth street partial through cut 476 in first surface 458 positioned generally opposite second cavity 468 and parallel relative to the first direction, where third street partial through cut 474 is arranged between second linear array of sensor elements 452 and second sacrificial portion 464, and fourth street partial through cut 476 is arranged between third linear array of sensor elements 454 and second sacrificial portion 464; forming at least a first through cut, a second through cut, a third through cut and a fourth through cut in the silicon wafer, the first and second through cuts are parallel to the first direction, the third and fourth through cuts are perpendicular to the first direction, where the first through cut is arranged adjacent to the linear array of sensor elements 450 opposite first sacrificial portion 462, the second through cut arranged adjacent to third linear array of sensor elements 454 opposite second sacrificial portion 464, and the third and fourth through cuts form a first end and a second end, respectively, of multi-row sensor chip 478 defined by the first, second, third and fourth through cuts; bonding at least a portion of multi-row sensor chip 478 formed by second surface 460 of portion 456 of the silicon wafer to mounting substrate 480; and, removing first sacrificial portion 462 and second sacrificial portion 464. However, it should be appreciated that the step of forming at least first street partial through cut 470 and second street partial through cut 472 occurs for embodiments wherein sacrificial portion 462 is removed by cleaving, as described in greater detail below. Thus, in embodiments wherein sacrificial portion 462 is not removed by cleaving, the first and second street partial through cuts may not be formed.

Figure 17:
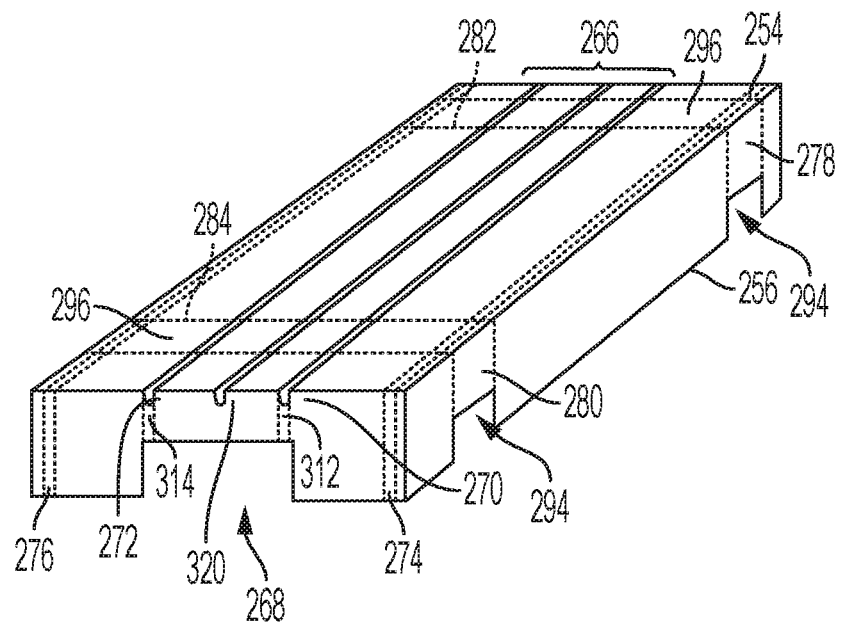
FIG. 17 is a perspective view of a portion of a silicon wafer including a multi-row light emitting chip before separation from the silicon wafer depicted in FIG. 14 with the light emitting elements and electrical connections removed for clarity and further depiction of cavity cuts within the bottom surface of the silicon wafer and the relative arrangement of various street and column cuts within the top surface of the silicon wafer, both partial through cuts and full through cuts.
Figure 18:
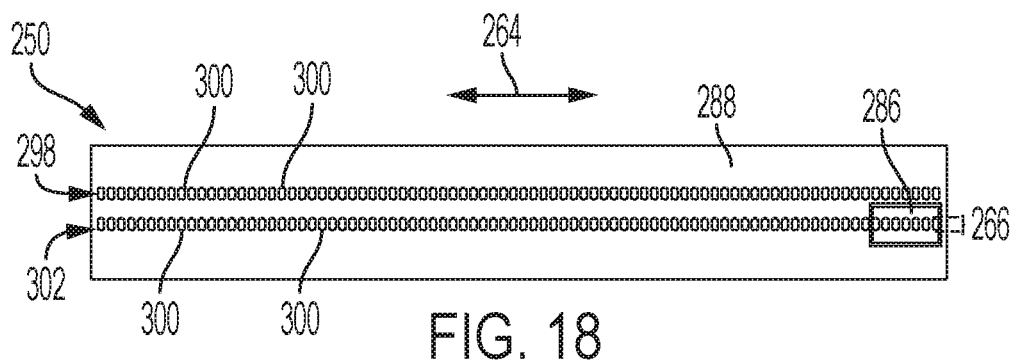
FIG. 18 is a top plan view of a dual linear light emitter array formed by using an embodiment of a presently disclosed method of fabricating a light emitter array having a single multi-row light emitting chip positioned on a mounting substrate.
Figure 21:
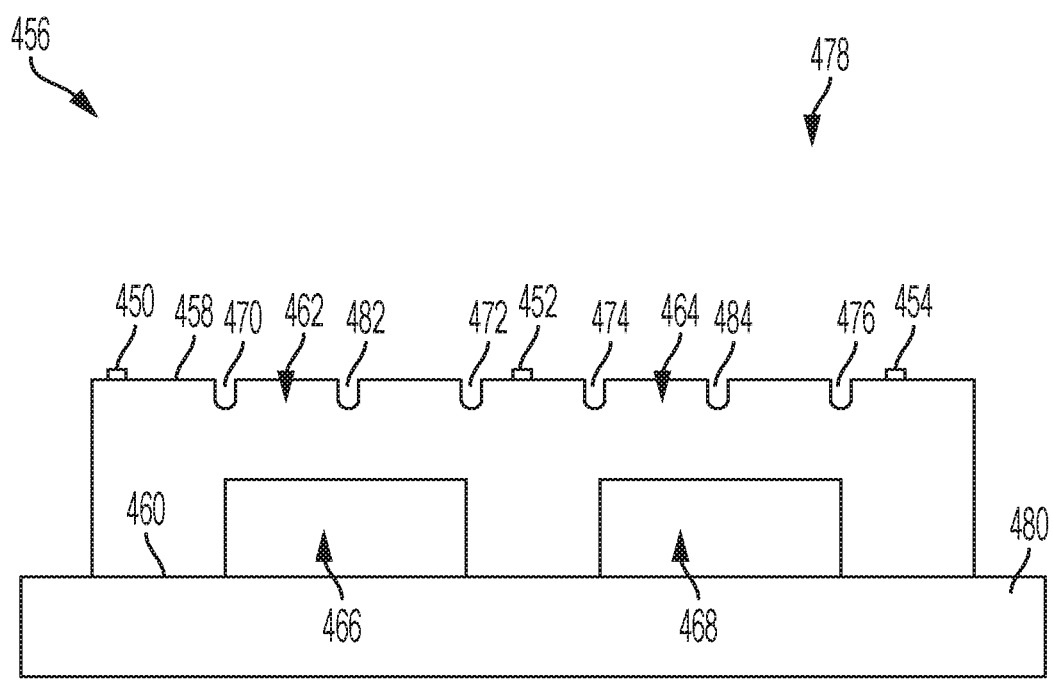

It should be appreciated that although the first, second, third and fourth through cuts are not shown in the figures relative to the foregoing embodiment, these through cuts are similar to the through cuts depicted in FIGS. 5 and 17. In each embodiment, these through cuts are used to define the outer edges of the multi-row sensor chip prior to removal of the sacrificial portion or portions. Moreover, although only three aligned arrays of sensors are depicted in FIG. 21 and discussed relative to this embodiment, it should be appreciated that more than three aligned arrays may be formed using the same method by repeating the various steps, and that light emitters may be formed as opposed to sensors. Still further, additional street partial through cuts may be formed to assist with the removal of the sacrificial portions, e.g., street partial through cuts 482 and 484.

The present disclosure broadly includes processes of fabricating dual arrays of sensor chips or a plurality of arrays of sensor chips with near-perfect, i.e., sub-micron, alignment of the top/upper array to the bottom/lower array, or all arrays relative to each other. A silicon wafer is cut in a way to create a single chip that is three or more standard chips wide, i.e., three or more rows. One or more recesses are cut into the bottom surface of areas between arrays of sensor chips of these multi-row chips thereby forming one or more "sacrificial areas". An array of multi-row chips is then built using conventional chip placement techniques such that the bottom recesses straddle a second row of electrical connections on the circuit board, i.e., mounting substrate, for embodiments comprising two rows of sensor chips, straddle second and third rows of electrical connections on the circuit board for embodiments comprising three rows of sensor chips, etc. Upon completion of the bonding steps that create the array, the central, sacrificial area or areas are removed, exposing the electrical connections therebelow, resulting in two or more parallel arrays where each array is in near-perfect alignment with each other array, e.g., top array aligned with bottom array. The present methods provide the ability to make an array of sensors that are aligned with great precision. While the foregoing disclosure primarily discusses sensor arrays, this process may also be utilized for other types of arrays such as LED arrays, etc.

It will be appreciated that various of the above-disclosed and other features and functions, or alternatives thereof, may be desirably combined into many other different systems or applications. Various presently unforeseen or unanticipated alternatives, modifications, variations or improvements therein may be subsequently made by those skilled in the art which are also intended to be encompassed by the following claims.

What is claimed is:

1. A method of assembling a dual linear sensor array from a silicon wafer comprising a first surface and a second surface opposite the first surface, the first surface comprising at least a first linear array of sensor elements and a second linear array of sensor elements, each arranged parallel relative to a first direction, and a sacrificial portion positioned between the first linear array of sensor elements and the second linear array of sensor elements, the method comprising:
   forming a first reference through cut in the first surface parallel to the first direction;
   forming a second reference through cut in the first surface perpendicular to the first direction;
   forming a first cavity in the second surface positioned opposite the sacrificial portion and parallel relative to the first direction, the position of the first cavity being defined by a position of the first reference through cut;
   forming at least a first through cut, a second through cut, a third through cut and a fourth through cut in the silicon wafer, the first and second through cuts are parallel to the first direction, the third and fourth through cuts are perpendicular to the first direction, the first through cut arranged adjacent to the first linear array of sensor elements opposite the sacrificial portion, the second through cut arranged adjacent to the second linear array of sensor elements opposite the sacrificial portion, and the third and fourth through cuts form a first end and a second end, respectively, of a multi-row sensor chip defined by the first, second, third and fourth through cuts;
   forming a second cavity in the second surface perpendicular to the first direction, wherein a position of the second cavity is defined by a position of the second reference through cut;
   bonding at least a portion of the multi-row sensor chip formed by the second surface of the silicon wafer to a mounting substrate; and,
   removing the sacrificial portion.

2. The method of claim 1 further comprising:
   forming at least a first column partial through cut in the first surface positioned generally opposite the second cavity and perpendicular to the first direction.

3. The method of claim 1 further comprising:
   repeating the step of forming the first through cut, the second through cut, the third through cut and the fourth through cut at unique locations in the silicon wafer, thereby forming a plurality of multi-row sensor chips, each of the plurality of multi-row sensor chips comprises a first linear array of sensor elements and a second linear array of sensor elements, each arranged parallel relative to a first direction, and a sacrificial portion;
   bonding at least a portion of each of the plurality of multi-row sensor chips formed by the second surface of the silicon wafer adjacently to the mounting substrate; and,
   removing each of the plurality of sacrificial portions.

4. The method of claim 1 wherein the mounting substrate comprises at least a first row of electrical connectors and a second row of electrical connectors parallel to the first row, and the step of bonding at least a portion of the multi-row sensor chip formed by the second surface of the silicon wafer to the mounting substrate results in aligning the sacrificial portion over the second row of electrical connectors.

5. The method of claim 1 wherein at least one of: the step of forming the first cavity; and, the step of forming at least the first through cut, the second through cut, the third through cut and the fourth through cut, is performed by mechanical abrasion, laser cutting, chemical etching, or a combination thereof.

6. The method of claim 1 further comprising:
   bonding at least one first wire between a first electrical connector on the mounting substrate and the first linear array of sensor elements; and,
   bonding at least one second wire between a second electrical connector on the mounting substrate and the second linear array of sensor elements.

7. The method of claim 1 wherein the step of removing the sacrificial portion comprises:
   forming a fifth through cut positioned generally opposite the first cavity and parallel relative to the first direction, the fifth through cut arranged between the first linear array of sensor elements and the sacrificial portion; and,
   forming a sixth through cut positioned generally opposite the first cavity and parallel relative to the first direction, the fifth through cut arranged between the second linear array of sensor elements and the sacrificial portion.

8. The method of claim 1, prior to the step of bonding, further comprising:
   forming at least a first street partial through cut and a second street partial through cut in the first surface positioned generally opposite the first cavity and parallel relative to the first direction, the first street partial through cut arranged between the first linear array of sensor elements and the sacrificial portion, and the second street partial through cut arranged between the second linear array of sensor elements and the sacrificial portion.

9. The method of claim 8 wherein the step of removing the sacrificial portion comprises:
   cleaving the sacrificial portion along the first street partial through cut and along the second street partial through cut.

10. The method of claim 8 further comprising:
    forming at least a third street partial through cut in the first surface positioned generally opposite the first cavity and parallel relative to the first direction, the third street partial through cut arranged between the first street partial through cut and the second street partial through cut.

11. The method of claim 1 wherein the sacrificial portion comprises a third linear array of sensor elements.

12. A method of assembling a dual linear light emitting array from a silicon wafer comprising a first surface and a second surface opposite the first surface, the first surface comprising at least a first linear array of light emitting elements and a second linear array of light emitting elements, each arranged parallel relative to a first direction, and a sacrificial portion positioned between the first linear array of light emitting elements and the second linear array of light emitting elements, the method comprising:
 forming a first cavity in the second surface positioned opposite the sacrificial portion and parallel relative to the first direction;
 forming at least a first through cut, a second through cut, a third through cut and a fourth through cut in the silicon wafer, the first and second through cuts are parallel to the first direction, the third and fourth through cuts are perpendicular to the first direction, the first through cut arranged adjacent to the first linear array of light emitting elements opposite the sacrificial portion, the second through cut arranged adjacent to the second linear array of light emitting elements opposite the sacrificial portion, and the third and fourth through cuts form a first end and a second end, respectively, of a multi-row light emitting chip defined by the first, second, third and fourth through cuts;
 bonding at least a portion of the multi-row light emitting chip formed by the second surface of the silicon wafer to a mounting substrate, the mounting substrate comprising at least a first row of electrical connectors and a second row of electrical connectors parallel to the first row, and the step of bonding at least a portion of the multi-row light emitting chip formed by the second surface of the silicon wafer to the mounting substrate results in aligning the sacrificial portion over the second row of electrical connectors; and,
 removing the sacrificial portion.

13. The method of claim 12 further comprising:
 repeating the step of forming the first through cut, the second through cut, the third through cut and the fourth through cut at unique locations in the silicon wafer, thereby forming a plurality of multi-row light emitting chips, each of the plurality of multi-row light emitting chips comprises a first linear array of light emitting elements and a second linear array of light emitting elements, each arranged parallel relative to a first direction, and a sacrificial portion;
 bonding at least a portion of each of the plurality of multi-row light emitting chips formed by the second surface of the silicon wafer adjacently to the mounting substrate; and,
 removing each of the plurality of sacrificial portions.

14. The method of claim 12 wherein the step of removing the sacrificial portion comprises:
 forming a fifth through cut positioned generally opposite the first cavity and parallel relative to the first direction, the fifth through cut arranged between the first linear array of sensor elements and the sacrificial portion; and,
 forming a sixth through cut positioned generally opposite the first cavity and parallel relative to the first direction, the fifth through cut arranged between the second linear array of sensor elements and the sacrificial portion.

15. The method of claim 12, prior to the step of bonding, further comprising:
 forming at least a first street partial through cut and a second street partial through cut in the first surface positioned generally opposite the first cavity and parallel relative to the first direction, the first street partial through cut arranged between the first linear array of light emitting elements and the sacrificial portion, and the second street partial through cut arranged between the second linear array of light emitting elements and the sacrificial portion.

16. The method of claim 15 wherein the step of removing the sacrificial portion comprises:
 cleaving the sacrificial portion along the first street partial through cut and along the second street partial through cut.

17. The method of claim 15 further comprising:
 forming at least a third street partial through cut in the first surface positioned generally opposite the first cavity and parallel relative to the first direction, the third street partial through cut arranged between the first street partial through cut and the second street partial through cut.

18. The method of claim 12 wherein the sacrificial portion comprises a third linear array of light emitting elements.

19. A method of assembling at least three linear sensor arrays from a silicon wafer comprising a first surface and a second surface opposite the first surface, the first surface comprising at least a first linear array of sensor elements, a second linear array of sensor elements and a third linear array of sensor elements, each arranged parallel relative to a first direction, a first sacrificial portion positioned between the first linear array of sensor elements and the second linear array of sensor elements, and a second sacrificial portion positioned between the second linear array of sensor elements and the third linear array of sensor elements, the method comprising:
 forming a first cavity in the second surface positioned opposite the first sacrificial portion and parallel relative to the first direction;
 forming a second cavity in the second surface positioned opposite the second sacrificial portion and parallel relative to the first direction;
 forming at least a third street partial through cut and a fourth street partial through cut in the first surface positioned generally opposite the second cavity and parallel relative to the first direction, the third street partial through cut arranged between the second linear array of sensor elements and the second sacrificial portion, and the fourth street partial through cut arranged between the third linear array of sensor elements and the second sacrificial portion;
 forming at least a first through cut, a second through cut, a third through cut and a fourth through cut in the silicon wafer, the first and second through cuts are parallel to the first direction, the third and fourth through cuts are perpendicular to the first direction, the first through cut arranged adjacent to the first linear array of sensor elements opposite the first sacrificial portion, the second through cut arranged adjacent to the third linear array of sensor elements opposite the second sacrificial portion, and the third and fourth through cuts form a first end and a second end, respectively, of a multi-row sensor chip defined by the first, second, third and fourth through cuts;

bonding at least a portion of the multi-row sensor chip formed by the second surface of the silicon wafer to a mounting substrate; and, removing the first sacrificial portion and the second sacrificial portion.

* * * * *